United States Patent

Wang

(10) Patent No.: US 8,305,528 B2
(45) Date of Patent: Nov. 6, 2012

(54) LIQUID CRYSTAL DISPLAY AND MANUFACTURING METHOD THEREOF

(75) Inventor: Zheng Wang, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 234 days.

(21) Appl. No.: 12/886,873

(22) Filed: Sep. 21, 2010

(65) Prior Publication Data

US 2011/0069246 A1   Mar. 24, 2011

(30) Foreign Application Priority Data

Sep. 23, 2009   (CN) .......................... 2009 1 0093959

(51) Int. Cl.
G02F 1/1335   (2006.01)

(52) U.S. Cl. ........................................ 349/114; 349/48

(58) Field of Classification Search .................. 349/114, 349/48

See application file for complete search history.

(56) References Cited

U.S. PATENT DOCUMENTS

2007/0121035 A1   5/2007   Lee et al.

FOREIGN PATENT DOCUMENTS

| CN | 1719957 A | 1/2006 |
| CN | 1971357 A | 5/2007 |

*Primary Examiner* — Phu Vu (74) *Attorney, Agent, or Firm* — Ladas & Parry LLP (57) ABSTRACT

A liquid crystal display (LCD) comprises an array substrate and a color filter substrate, which are assembled together and sandwich liquid crystal therebetween. The array substrate comprises a gate line, a first data line and a second data line, which define a pixel region, a first pixel electrode and a first thin film transistor (TFT) for controlling the first data line to provide a first data voltage to the first pixel electrode in the pixel region, and a second pixel electrode and a second TFT for controlling the second data line to provide a second data voltage to the second pixel electrode. The color filter substrate comprises black matrixes and a color resin unit. The position of the first pixel electrode corresponds to the position of the color resin unit between the black matrixes so as to display a first image on a side of the color filter substrate in a light transmission mode; the position of the second pixel electrode corresponds to the position of the color resin unit on the black matrixes so as to display a second image on a side of the array substrate in a light reflection mode.

19 Claims, 7 Drawing Sheets

LIQUID CRYSTAL DISPLAY AND MANUFACTURING METHOD THEREOF

BACKGROUND

Embodiments of the invention relate to a liquid crystal display (LCD) and the manufacturing method thereof.

The main structure of a TFT-LCD (Thin Film Transistor Liquid Crystal Display) comprises an array substrate and a color filter substrate that are assembled together. The array substrate is provided with gate lines, data lines, and thin film transistors (TFTs) and pixel electrodes arranged in a matrix. The color filter substrate is provided with black matrixes, color resin units, and a common electrode. Liquid crystal is deflected through controlling the voltage difference between the pixel electrodes of the array substrate and the common electrode of the color filter substrate. Under the adjustment by liquid crystal, the light from a backlight is modified in different grey levels, so that different images can be displayed.

Currently, in a traditional LCD, a backlight is usually required for displaying images. As a backlight takes more than ⅔ of the whole power consumption, some techniques were used to adjust the brightness of the backlight in accordance with the light intensity of the surroundings so as to lower power consumption, which, however, fails to produce satisfactory effect. In addition, a semi-transmission/semi-reflection LCD is used, but the technique is limited to "single-side displaying."

SUMMARY

An embodiment of the invention provides a liquid crystal display (LCD) comprising an array substrate and a color filter substrate that are assembled together and sandwich liquid crystal therebetween. The array substrate comprises a gate line, a first data line and a second data line, which define a pixel region, a first pixel electrode and a first thin film transistor (TFT) for controlling the first data line to provide a first data voltage to the first pixel electrode in the pixel region, and a second pixel electrode and a second TFT for controlling the second data line to provide a second data voltage to the second pixel electrode. The color filter substrate comprises black matrixes and a color resin unit. The position of the first pixel electrode corresponds to the position of the color resin unit between the black matrixes so as to display a first image on a side of the color filter substrate in a light transmission mode; the position of the second pixel electrode corresponds to the position of the color resin unit on the black matrixes so as to display a second image on a side of the array substrate in a light reflection mode.

Another embodiment of the invention provides a method of manufacturing a liquid crystal display (LCD) comprising: step 1, preparing an array substrate and a color filter substrate, wherein the array substrate the array substrate comprises a gate line, a first data line and a second data line, which define a pixel region, a first pixel electrode and a first thin film transistor (TFT) for controlling the first data line to provide a first data voltage to the first pixel electrode in the pixel region, and a second pixel electrode and a second TFT for controlling the second data line to provide a second data voltage to the second pixel electrode; and wherein the color filter substrate comprises black matrixes and a color resin unit; and step 2, assembling the array substrate and the color filter substrate together, wherein the position of the first pixel electrode corresponds to the position of the color resin unit between the black matrixes so as to display a first image on the side of the color filter substrate in a light transmission mode, and the position of the second pixel electrode corresponds to the position of the color resin unit on the black matrixes so as to display a second image on a side of the array substrate in a light reflection mode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Hereinafter detailed description of the embodiments will be given with references to the accompanying drawings. The thicknesses of thin films in the drawings and the sizes and shapes of regions are not drawn based on the real scales in an array substrate or a color filter substrate of a TFT-LCD but for illustration only.

Figure 1:
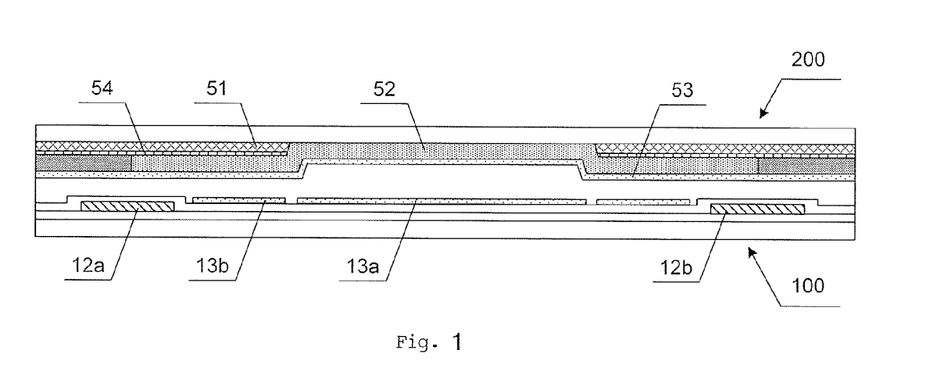
FIG. 1 is a schematic structure view of a LCD.

FIG. 1 is a schematic structure view of a LCD according to one embodiment of the invention. As shown in FIG. 1, the main structure of the LCD comprises a TFT-LCD array substrate 100 and a color filter substrate 200, which are assembled together with liquid crystal filled therebetween. On the TFT-LCD array substrate 100 are formed gate lines, first data lines 12a, and second data lines 12b. Adjacent gate lines, first data line 12a, and second data line 12b define a plurality of pixel regions arranged in a matrix. A first TFT, a second TFT, a first pixel electrode 13a, and a second pixel electrode 13b are formed in each pixel region. The gate lines are used to provide turn-on or turn-off signals to the first TFT and the second TFT. The first TFT is used to control the first data line 12a to provide a first data voltage to the first pixel electrode 13a; the second TFT is used to control the second data line 12b to provide a second data voltage to the second pixel electrode 13b. Black matrixes 51, color resin units 52, a common electrode 53, and reflecting layers 54 are formed on the color filter substrate 200. The black matrixes 51 are formed on the base substrate; the reflecting layers 54 for producing a total reflection or a diffuse reflection are formed on the black matrixes 51; the color resin units 52 of three colors are formed between and on the black matrixes 51, i.e., a part of each color resin unit 52 is formed between the black matrixes 51, and the other part is formed on the black matrixes 51. The common electrode 53 is formed on the above patterns. Furthermore, the position of the first pixel electrode 13a in each pixel region on the TFT-LCD array substrate corresponds to the position of the color resin unit 52 between the black matrixes 51 on the color filter substrate 200, so as to display a first image on the side of the color filter substrate 200 in a light transmission mode; the position of the second pixel electrodes 13a in each pixel region on the TFT-LCD array substrate correspond to the position of the color resin unit 52 on the black matrixes 51 on the color filter substrate 200, so as to display a second image on the side of the TFT-LCD array substrate in a light reflection mode.

Hereinafter, the LCD according to the embodiment of the invention is further described with the structures of the TFT-LCD array substrate and the color filter substrate.

Figure 2:
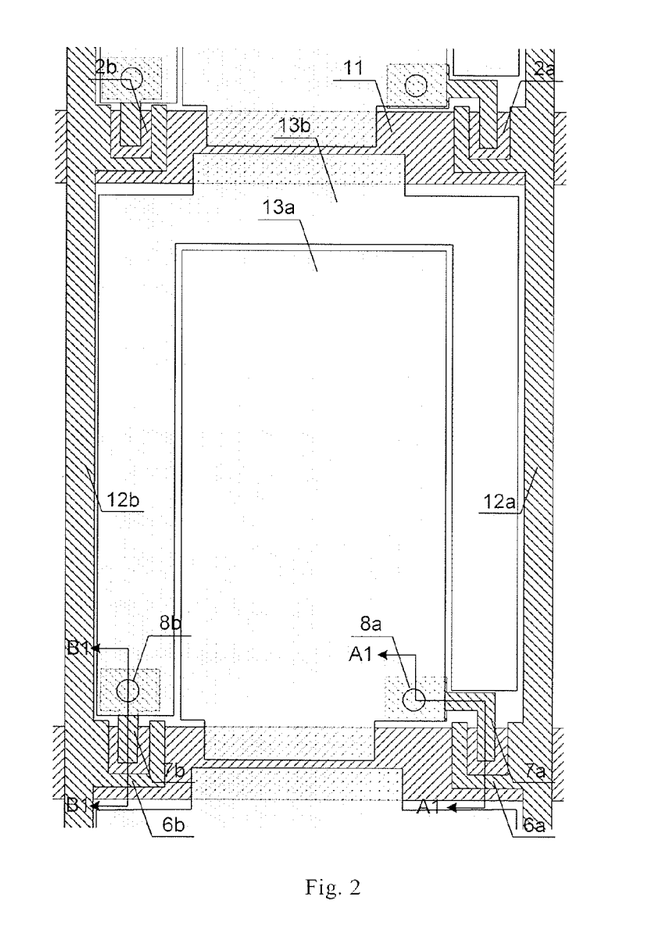
FIG. 2 is a plan view of a TFT-LCD array substrate.
Figure 3:
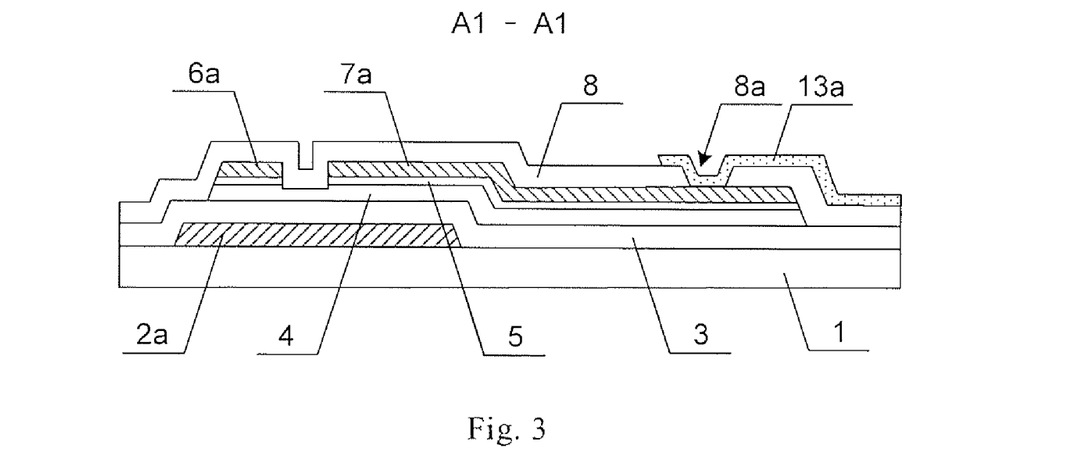
FIG. 3 is a sectional view along A1-A1 of FIG. 2.
Figure 4:
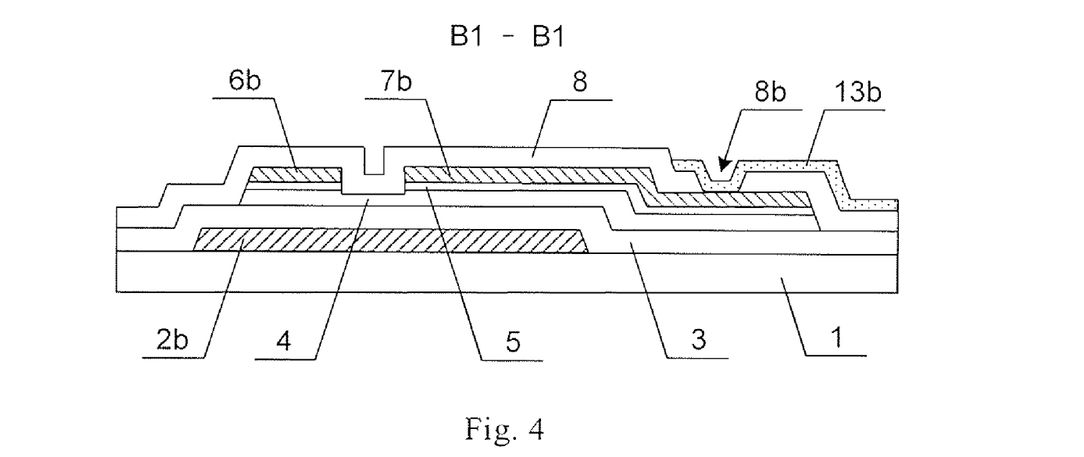
FIG. 4 is a sectional view along B1-B1 of FIG. 2.

FIG. 2 is a plan view of the TFT-LCD array substrate of the embodiment, showing the structure of one pixel region, FIG. 3 is a sectional view along A1-A1 of FIG. 2, and FIG. 4 is a sectional view along B1-B1 of FIG. 2.

As shown in FIG. 2 to FIG. 4, the main structure of the LCD array substrate comprises gate lines 11, a first data line 12a, and a second data line 12b. Adjacent gate lines 11, first data line 12a, and second data line 12b define a plurality of pixel regions arranged in a matrix. A first TFT, a second TFT, a first pixel electrode 13a, and a second pixel electrode 13b are formed in each pixel region. The gate lines are used to provide turn-on or turn-off signal to the first TFT and the second TFT. The first TFT is used to control the first data line 12a to provide a first data voltage to the first pixel electrode 13a; the second TFT is used to control the second data line 12b to provide a second data voltage to the first pixel electrode 13b. The first TFT according to the embodiment comprises a first gate electrode 2a, a first active layer, a first source electrode 6a, and a first drain electrode 7a; the second TFT comprises a second gate electrode 2b, a second active layer, a second source electrode 6b, and a second drain electrode 7b. Each gate line 11, the first gate electrode 2a, and the second gate electrode 2b are formed on the substrate 1; they are in an integral structure. The gate insulating layer 3 is formed on the gate line 11, the first gate electrode 2a, and the second gate electrode 2b; the gate insulating layer 3 covers the entire substrate 1. The first active layer (including the semiconductor layer 4 and the doped semiconductor layer 5) is formed on the gate insulating layer 3 and is disposed over the first gate electrode 2a; the first source electrode 6a and the first drain electrode 7a are formed on the first active layer; one end of the first source electrode 6a is disposed above the first gate electrode 2a, the other end is connected to the first data line 12a; one end of the first drain electrode 7a is disposed above the first gate electrode 2a, the other end is connected to the first pixel electrode 13a; a first channel region is formed between the first source electrode 6a and the first drain electrode 7a; the doped semiconductor layer 5 in the first TFT channel region is completely etched away, and the semiconductor 4 is etched to some thickness, so that the semiconductor layer 4 is exposed in the first TFT channel region. The second active layer (including the semiconductor layer 4 and the doped semiconductor layer 5) is formed on a gate insulating layer 3 and is disposed over the second gate electrode 2b; the second source electrode 6b and the second drain electrode 7b are formed on the second active layer, one end of the second source electrode 6b is disposed above the second gate electrode 2b, the other end is connected to the second data line 12b; one end of the second drain electrode 7b is disposed above the second gate electrode 2b, the other end is connected to the second pixel electrode 13b; a second channel region is formed between the second source electrode 6b and the second drain electrode 7b; the doped semiconductor layer 5 in the second TFT channel region is completely etched away, and the semiconductor 4 is etched to some thickness, so that the semiconductor layer 4 is exposed in the second TFT channel region. A passivation layer 8 is formed on the above structures. In the passivation layer 8, a first via hole 8a is provided at the position of the first drain electrode 7a, and a second via hole 8b is provided at the position of the second drain electrode 7b. The first pixel electrode 13a and the second pixel electrode 13b are formed on the passivation layer; the first pixel electrode 13a is disposed in the central portion of the pixel region, and the second pixel electrode 13b is disposed in the periphery of the first pixel electrode 13a. The first pixel electrode 13a is connected to the first drain electrode 7a via the first via hole 8a; the second pixel electrode 13b is connected to the second drain electrode 7b via the second via hole 8b.

FIG. 5 to FIG. 13 is a schematic view of the manufacturing process of the TFT-LCD array substrate. Hereinafter, the patterning process as referred to in this disclosure comprises applying photoresist, exposing and developing of photoresist, etching, removing remaining photoresist, and etc. Positive type photoresist is taken as the example of the photoresist.

Figure 5:
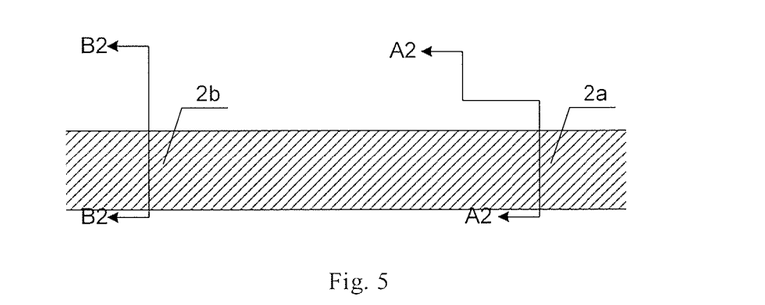
FIG. 5 is a plan view of the TFT-LCD array substrate after the first patterning process.
Figure 6:
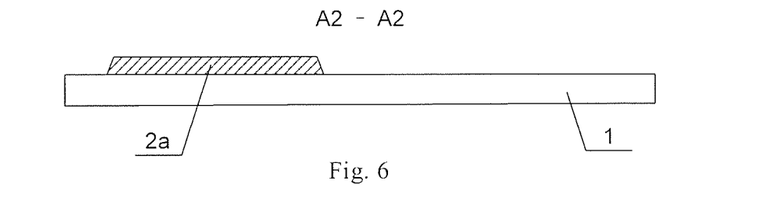
FIG. 6 is a sectional view taken along A2-A2 of FIG. 5.
Figure 7:
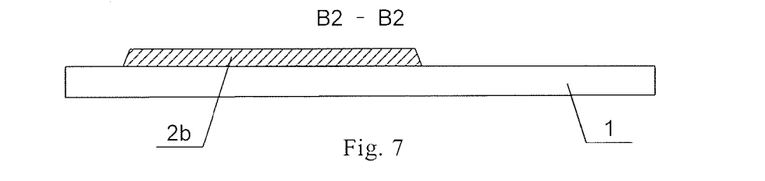
FIG. 7 is a sectional view taken along B2-B2 of FIG. 5.

FIG. 5 is a plan view of the TFT-LCD array substrate after a first patterning process, showing the structure of one pixel region; FIG. 6 is a sectional view taken along A2-A2 of FIG. 5, and FIG. 7 is a sectional view taken along B2-B2 of FIG. 5.

First, through a magnetron sputtering or thermal evaporation method, a gate metal film is deposited on a substrate 1 (such as a glass substrate or a quartz substrate); patterns of the gate lines 11, the first gate electrode 2a, and the second gate electrode 2b are formed on the substrate 1 with a normal mask. The first gate electrode 2a and the second gate electrode 2b are integrally formed with the gate lines 11, as shown in FIG. 5 to FIG. 7. The gate metal film can be a single-layered film made from aluminum, chromium, tungsten, copper, tantalum, titanium, molybdenum, or aluminum and nickel, or a composite film of any combination of the metal thin films.

Figure 8:
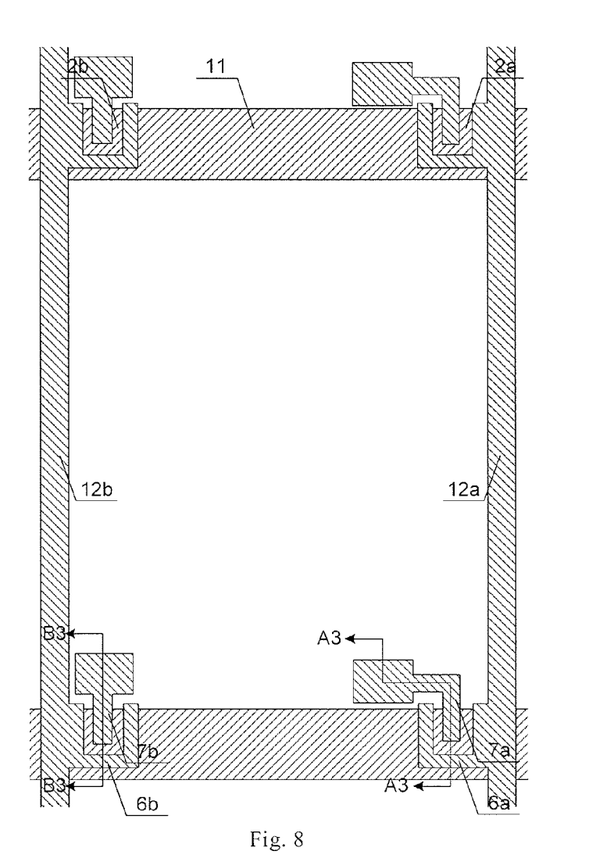
FIG. 8 is a plan view of the TFT-LCD array substrate after the second patterning process.
Figure 9:
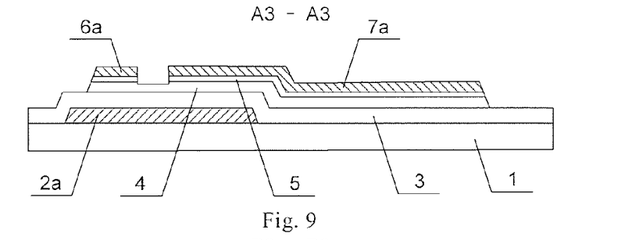
FIG. 9 is a sectional view taken along A3-A3 of FIG. 8.
Figure 10:
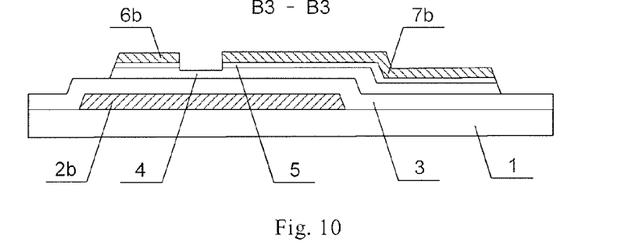
FIG. 10 is a sectional view taken along B3-B3 of FIG. 8.

FIG. 8 is a plan view of the TFT-LCD array substrate after a second patterning process, showing the structure of one pixel region; FIG. 9 is a sectional view taken along A3-A3 of FIG. 8; FIG. 10 is a sectional view taken along B3-B3 of FIG. 8.

First, a gate insulating layer 3, a semiconductor film, and a doped semiconductor layer are deposited successively on the substrate with the pattern shown in FIG. 5 thereon through a plasma enhanced chemical vapor deposition (PECVD) method; next, a source/drain metal thin film is deposed through a magnetron sputtering or thermal evaporation method. Patterns of the first active layer, the first data line 12a, the first source electrode 6a, the first drain electrode 7a, the second active layer, the second data line 12b, the second source electrode 6b, and the second drain electrode 7b is formed by a patterning process by using a half-tone or grey tone mask, as shown in FIG. 8 to FIG. 10. After the patterning process, the first data line 12a is disposed on one side of the pixel region, while the second data line 12b is disposed on the other side of the pixel region. The first active layer (including the semiconductor layer 4 and the doped semiconductor layer 5) is formed on the gate insulating layer 3 and is disposed over the first gate electrode 2a; the first source electrode 6a and the first drain electrode 7a are formed on the first active layer, one end of the first source electrode 6a is disposed above the first gate electrode 2a and the other end is connected to the first data line 12a; one end of the first drain electrode 7a is disposed above the first gate electrode 2a and opposite to the first source electrode 6a; a first channel region is formed between the first source electrode 6a and the first drain electrode 7a; the doped semiconductor layer 5 in the first TFT channel region is completely etched away, and the semiconductor 4 is etched to some thickness, so that the semiconductor layer 4 is exposed in the first TFT channel region. The second active layer (including the semiconductor layer 4 and the doped semiconductor layer 5) is formed on a gate insulating layer 3 and is disposed over the first gate electrode 2b, the second source electrode 6b and the second drain electrode 7b are formed on the second active layer, one end of the second source electrode 6b is disposed above the second gate electrode 2b and opposite to the second source electrode 6b; one end of the second drain electrode 7b is disposed above the second gate electrode 2b, the other end is connected to the second pixel electrode 13b; a second channel region is formed between the second source electrode 6b and the second drain electrode 7b; the doped semiconductor layer 5 in the second TFT channel region is completely etched away, and the semiconductor 4 is etched to some thickness, so that the semiconductor layer 4 is exposed in the second TFT channel region. The gate insulating layer can be made of a material such as silicon nitride or aluminum oxide; the source/drain electrode can be a single-layered film of Aluminum, Chromium, Tungsten, Copper, Tantalum, Titanium, Molybdenum, or Aluminum and Nickel, or a composite film of any combination of the metal thin films.

The patterning process is a multi-step process. The process may comprise the following steps. First, applying a photoresist layer on the source/drain metal thin film; exposing the photoresist with a half tone mask or grey tone mask, so that the photoresist after exposure forms into a completely exposed region, an unexposed region, and a partially exposed region, among which the unexposed region corresponds to the region of the first data line, the second data line, the first source electrode, the first drain electrode, the second source electrode, and the second source electrode, the partially exposed region corresponds to the region of the first TFT channel region and the second TFT channel region, and the completely exposed region corresponds to the region other than the aforementioned patterns. After development, the thickness of the photoresist in the unexposed region may remain substantially unchanged, thus the unexposed region is transformed into a region where photoresist is fully retained; the photoresist in the completely exposed region is completely removed, thus the completely exposed are is transformed into a region where photoresist is completely removed; the thickness of the photoresist in the partially exposed region is reduced, thus the partially exposed region is transformed into a region where photoresist is partially retained. The source/drain metal thin film, the doped semiconductor thin film, and the semiconductor thin film in the completely exposed region is completely etched away with a first etching process, so as to form the patterns of the first active layer, the second active layer, the first data line, and the second data line. The photoresist in the partially exposed region is removed by an ashing process, so as to expose the source/drain metal thin film in this region. With a second etching process, the source/drain metal thin film and the doped semiconductor in the partially exposed region is completely etched away, and some thickness the semiconductor thin film is etched, so that the semiconductor is exposed in the region, forming the patterns of the first source electrode, the first drain electrode, the second source electrode, the second drain electrode, the first TFT channel region, and the second channel region. In the end, the remaining photoresist is removed, and the second patterning process is completed here. Because the first data line, the second data line, the first active layer, and the second active layer are formed in the same patterning process, the semiconductor thin film and the doped semiconductor thin film are retained below the first data line and the second data line.

Figure 11:
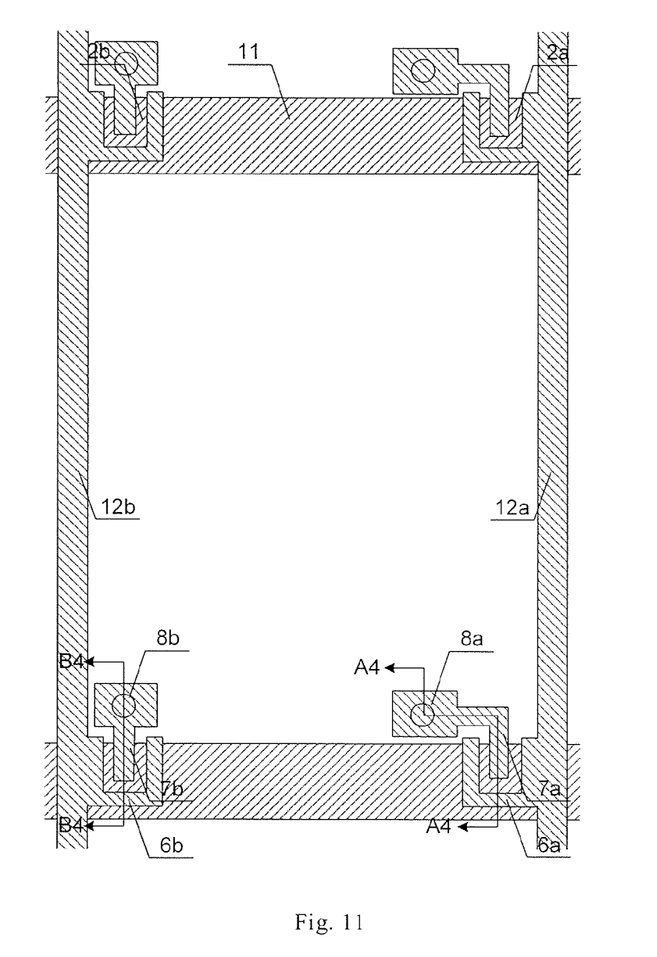
FIG. 11 is a plan view of the TFT-LCD array substrate after the third patterning process.
Figure 12:
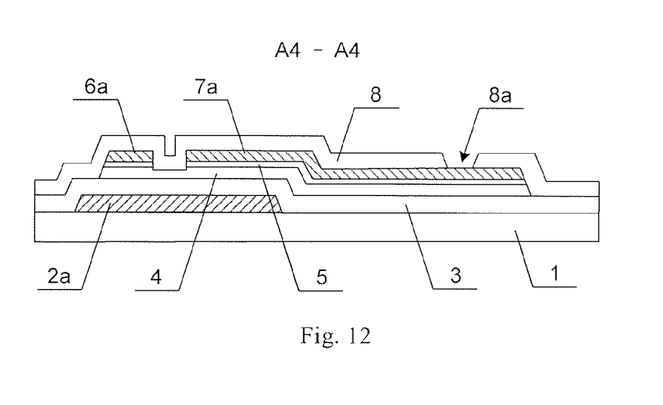
FIG. 12 is a sectional view taken along A4-A4 of FIG. 11.
Figure 13:
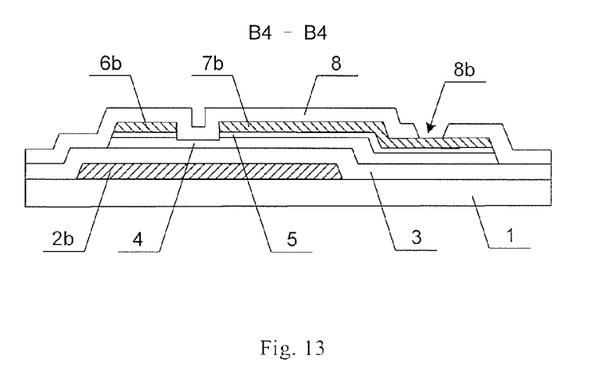
FIG. 13 is a sectional view taken along B4-B4 of FIG. 11.

FIG. 11 is a plan view of the TFT-LCD array substrate after a third patterning process, showing the structure of one pixel region; FIG. 12 is a sectional view taken along A4-A4 of FIG. 11, and FIG. 13 is a sectional view taken along B4-B4 of FIG. 11.

A passivation layer 8 is deposited on the substrate with the pattern shown in FIG. 8 thereon through a PECVD method. The patterns of the first via hole 8a and the second via hole 8b is formed through a patterning process with a normal mask, the first via hole 8a is formed at the first drain electrode 7a, the second via hole 8b is formed at the second drain electrode 7b, the passivation 8 within the first via hole 8a and the second via hole 8b is etched away, which exposes, respectively, the surface of the first drain electrode 7a and the surface of the second drain electrode 7b, as shown in FIG. 11 to FIG. 13. In the patterning process, there are also formed a gate line pad via hole, a data line pad via hole, and etc. The structure and forming process of a gate line pad via hole and a data line pad via hole has been widely used, whose detailed description is, therefore, omitted.

Through a magnetron sputtering or thermal evaporation method, a layer of transparent conductive film is deposited on the substrate with the above patterns thereon. The patterns of the first pixel electrode 13a and the second pixel electrode 13b are formed through a patterning process with a normal mask. The first pixel electrode 13a is formed in the central portion of the pixel region and is connected to the first drain electrode 7a via the first via hole 8a; the second pixel electrode 13b is formed in the periphery of the first pixel electrode 13a and is connected to the second drain electrode 7b via the second via hole 8b, as shown in FIG. 2 to FIG. 4. In addition, the part of the first pixel electrode 13a disposed on the gate line 11 and the gate line 11 can form a first storing capacitor in the structure of storage capacitor on the gate line (Cs on gate), helpful to keep the voltage of the first pixel electrode 13a; the part of the second pixel electrode 13b disposed on the gate line 11 and the gate line 11 form a second storing capacitor in the structure of storage capacitor on the gate line (Cs on gate), helpful to keep the voltage of the second pixel electrode 13b. The transparent conductive film can be made of Indium Tin oxide, Indium Zinc oxide, or Aluminum Zinc oxide.

It is necessary to point out that the patterning processes as described above are merely one example to produce the TFT-LCD array substrate. The array substrate can be implemented by adding patterning processes or selecting different materials or different combinations of materials. For example, the second patterning process of the TFT-LCD array substrate can be accomplished by two separate patterning processes with normal masks, i.e., the patterns of the first active layer and the second active layer are formed by one patterning process with a normal mask, while the patterns of first data line, the second data line, the first source electrode, the first drain electrode, the second source electrode, the second drain electrode, the first TFT channel region, and the second TFT channel region are formed by another patterning process with a normal mask. For another example, the TFT-LCD array substrate can have common electrode lines disposed in the same layer with the gate lines, so that storing capacitors with the structure of storing capacitor on the common electrode line (Cs on Common) are formed respectively between the first pixel electrodes and the common electrode lines and between the second pixel electrodes and the common electrode lines. For still another example, the positions and layouts of the two TFTs in the TFT-LCD array substrate are merely for illustration, and can be adjusted as necessary.

Figure 14:
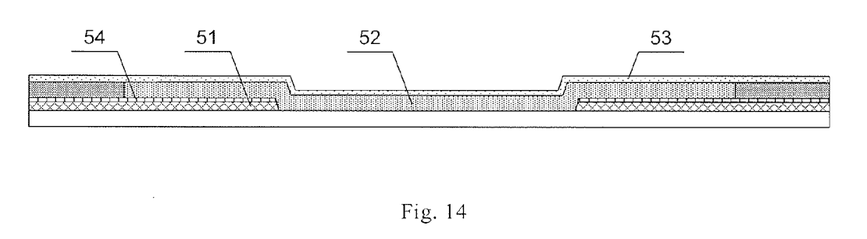
FIG. 14 is a view showing the structure of the color filter substrate.

FIG. 14 is a view showing the structure of the color filter substrate according to the embodiment. The main structure of the color filter substrate according to the embodiment comprises black matrixes 51, color resin units 52, a common electrode 53, and reflecting layers 54. The black matrixes 51 are formed on a substrate; the reflecting layers 54 for producing a total reflection or a diffuse reflection are formed on the black matrixes 51; the color resin unit 52 include a red resin pattern, a blue resin pattern, and a green resin pattern, which are formed between and on the black matrixes 51, i.e., a part of each color resin unit 52 is formed between the black matrixes 51, and the other part is formed on the black matrixes 51. The common electrode 53 is formed on the pattern of the above structure. The color filter substrate according to the embodiment can further comprise post-shaped spacers, which are used to keep the gap between the TFT-LCD array substrate and the color filter substrate when the two substrates are assembled together. The reflecting layer can be made of a material such as copper, aluminum or other metal or alloy, which can produce a total reflection or diffuse reflection.

The manufacturing process of the color filter substrate can be a traditional process. A brief description of the manufacturing process is given below. First, depositing, successively, a black matrix material layer and a reflection thin film on the substrate (such as a glass substrate or a quartz substrate); next, forming the pattern of black matrixes and reflecting layers through a patterning process, wherein the reflecting layers are disposed on the black matrixes; applying a layer of red resin material on the substrate with the aforementioned pattern formed thereon; forming the pattern of the red resin units through the processes of exposing, developing, baking, and etc., wherein a part of each red resin unit is disposed between black matrixes and other part is disposed on black matrixes; forming, successively, the pattern of blue resin units and the pattern of green resin units with the similar method; The patterns of the three colors can be formed in any sequence. The resin units of each color can cover ½ of the black matrixes; the color resin units of each color can contact one another. A layer of transparent conductive film is deposited on the substrate with the aforementioned patterns formed thereon through a magnetron sputtering or thermal evaporation method, so as to form the common electrode.

It is necessary to point out that the aforementioned method of manufacturing the color filter substrate is merely one example among many; different processing sequences, materials, and means can be employed as necessary.

After respectively manufacturing the array substrate 100 and the color filter substrate 200 according to the embodiment, the TFT-LCD substrate 100 and the color filter substrate 200 are assembled together in vacuum; each first pixel electrodes 13a on the TFT-LCD array substrate 100 is set corresponding to one color resin unit 52 on the color filter substrate 200; each second pixel electrode 13b on the TFT-LCD array substrate 100 is set corresponding to a part of the black matrixes 51 on the color filter substrate 200.

Figure 15:
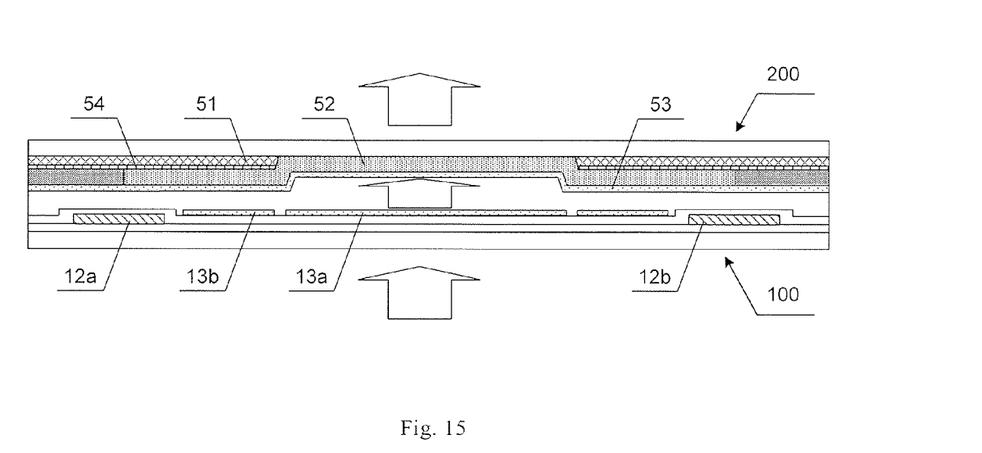
FIG. 15 is a schematic view showing the LCD displaying a first image in a transmission mode.
Figure 16:
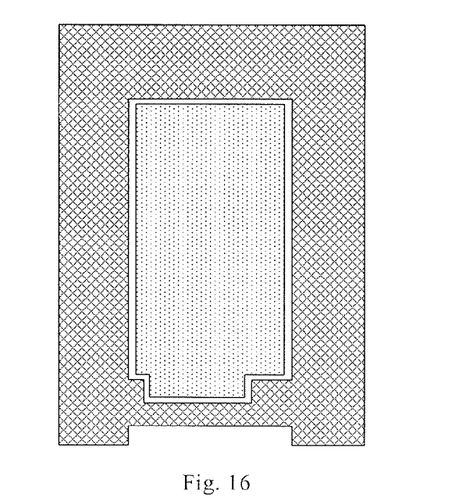
FIG. 16 is a shape of a pixel electrode viewed from the side of the color filter substrate of the LCD.

FIG. 15 is a schematic view showing the LCD of the embodiment displaying a first image in a transmission mode; FIG. 16 is a shape of a pixel electrode viewed from the side of the color filter substrate of the LCD of the embodiment. To display the first image in a transmission mode, light A from the side of the TFT-LCD array substrate 100 transmits through the first pixel electrode 13a, the liquid crystal, and the color resin unit 52 and forms the first image on the side of the color filter substrate 200, while the region other than the first image is shielded by the black matrixes, as shown in FIG. 15 and FIG. 16.

Figure 17:
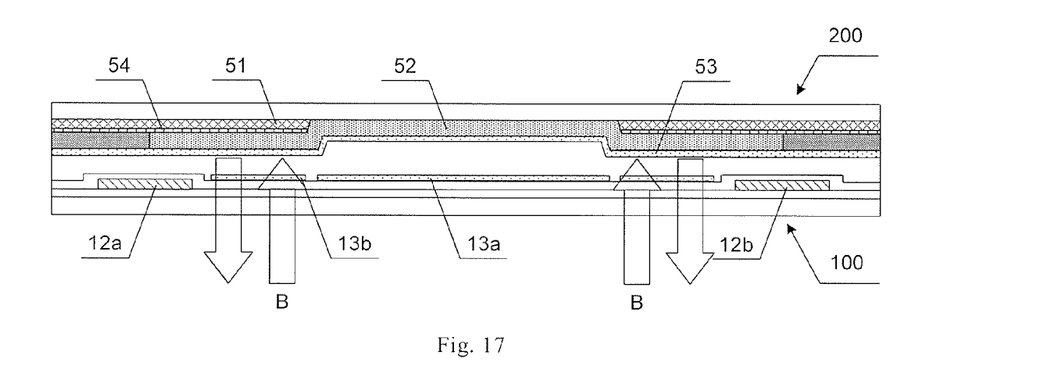
FIG. 17 is a schematic view showing the LCD displaying a second image in a reflection mode.
Figure 18:
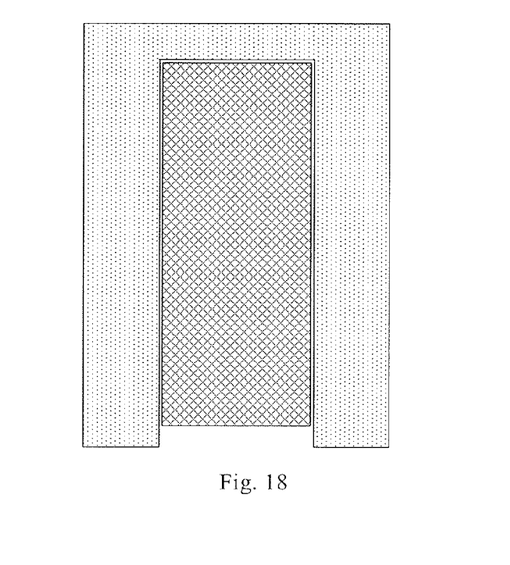
FIG. 18 is a shape of a pixel electrode viewed from the side of the TFT-LCD array substrate of the LCD.

FIG. 17 is a schematic view showing the LCD of the embodiment displaying a second image through the reflection mode; FIG. 18 is a shape of a pixel electrode viewed from the side of the TFT-LCD array substrate of the LCD of the embodiment. To display the image in a reflection mode, light B from the side of the TFT-LCD array substrate 100 passes through the second pixel electrode 13b, the liquid crystal, and the color resin unit 52 and then is reflected at the black matrixes 51 by the reflecting layers 54; the reflected light transmits through the color resin units 52, the liquid crystal, and the second pixel electrode 13b and forms the second image on the side of the TFT-LCD array substrate 100. In the meanwhile, the first data line inputs a controlling voltage to the first pixel electrode so that the region of the first pixel electrode appears black, as shown in FIG. 17 and FIG. 18.

The thickness of the black matrixes can be approximately 1 μm, and the thickness of the color resin units can be approximately 3 μm. The light path can be adjusted by adjusting the thicknesses of the black matrixes and the color resin units for obtaining normal displaying.

The embodiment provides a LCD that can display on both sides without a backlight. The pixel structure of the LCD according to the embodiment employs a double-pixel electrode structure, one pixel electrode uses a semi-transmission design, the other one uses a semi-reflection design, which renders the LCD capable to respectively display the contents of two images, and thus increases displaying content of the displaying device. The LCD according to the embodiment can use sunlight for displaying outdoor; its structure without a backlight significantly lowers energy consumption and thus is more suitable to portable devices that are required to sustain for long time continuation. In the meantime, absence of the backlight lowers the cost and reduces the pollution to the environment by the fluorescent powder in the fluorescent tube. The luminance of a traditional backlight is 4000 lumens, while the outdoor sunlight in a sunny day has a luminance greater than 5000 lumens, the LCD according to the embodiment can therefore assure the displaying quality. The LCD according to the embodiment has a pixel structure whose characteristics can lead to lowering of an individual pixel's luminance. Also, it is also possible to increase image luminance by increasing the displaying regions of the pixels.

The process of manufacturing a LCD according to the embodiment may comprise the following steps.

Step 1 of preparing, respectively, a TFT-LCD array substrate and a color filter substrate, wherein the TFT-LCD array substrate comprises gate lines, first TFTs for controlling respective first data lines to provide a first data voltage to respective first pixel electrodes, second TFTs for controlling respective second data lines to provide a second data voltage to respective second pixel electrodes, and wherein the color filter substrate comprises black matrixes, color resin units, and a common electrode;

Step 2 of assembling the TFT-LCD array substrate and the color filter substrate together, wherein the position of each of the first pixel electrodes corresponds to the position of one color resin unit between the black matrixes, so as to display a first image on the side of the color filter substrate in a light transmission mode, and the position of each of the second pixel electrodes corresponds to the position of one color resin units on the black matrixes, so as to display a second image on the side of the TFT-LCD array substrate in a light reflection mode.

The process of manufacturing a TFT-LCD array substrate according to the embodiment may comprises the following steps.

Step 11 of forming patterns including gate lines, first gate electrodes, and second pixel electrodes on a base substrate through a patterning process;

Step 12 of forming, on the substrate of the previous step, patterns including first data lines, second data lines, first source electrodes, first drain electrodes, second pixel electrodes, and second drain electrodes by a patterning process;

Step 13 of forming, on the substrate of the previous step, patterns of first via holes and second via holes, wherein the first via holes are disposed above the respective first drain electrodes, and the second via holes are disposed above the respective second drain electrode;

Step 14 of forming, on the substrate of the previous step, patterns including first pixel electrodes and second pixel electrodes, wherein each of the first pixel electrodes is disposed in the central portion of the corresponding pixel region and is connected to the corresponding first drain electrode through the corresponding first via hole, and each of the second pixel electrodes is disposed in the periphery of the corresponding pixel region and is connected to the corresponding second drain electrode through the corresponding second via hole.

The process of manufacturing a TFT-LCD array substrate according to the embodiment has been described in detail with reference to FIG. 5 to FIG. 13. The step 12 can be accomplished through one patterning process with a half-tone or grey tone mask, or through two patterning processes with a normal mask.

The process of manufacturing a color filter substrate according to the embodiment may comprise the following steps.

Step 21 of forming patterns of black matrixes and reflecting layers on a base substrate, wherein the reflecting layers are disposed on the black matrixes;

Step 22 of forming color resin units on the substrate of the previous step, wherein a part of each color resin unit is formed between the black matrixes, and the other part is formed on the black matrixes.

During manufacturing of a color filter substrate, a common electrode may be further formed.

Lastly, the aforementioned embodiments are employed to describe, not to limit, the technique of the invention. Notwithstanding that a detailed description is give with references to the aforementioned preferred embodiments, as one of ordinary skill in the art understands, the technique embodied in the aforementioned embodiments can be modified, or some technical features can be substituted with the equivalents; such modifications or substitutions do not deviate the nature of the technique from the spirit and scope of the technique embodied in the embodiments according to the invention.

What is claimed is:

1. A liquid crystal display (LCD) comprising an array substrate and a color filter substrate that are assembled together and sandwich liquid crystal therebetween,
   wherein the array substrate comprises:
      a gate line, a first data line and a second data line, which define a pixel region,
      a first pixel electrode and a first thin film transistor (TFT) for controlling the first data line to provide a first data voltage to the first pixel electrode in the pixel region, and
      a second pixel electrode and a second TFT for controlling the second data line to provide a second data voltage to the second pixel electrode,
   wherein the color filter substrate comprises black matrixes and a color resin unit, and
   wherein the position of the first pixel electrode corresponds to the position of the color resin unit between the black matrixes so as to display a first image on a side of the color filter substrate in a light transmission mode; the position of the second pixel electrode corresponds to the position of the color resin unit on the black matrixes so as to display a second image on a side of the array substrate in a light reflection mode.

2. The LCD according to claim 1, wherein the LCD utilizes environmental light rather than light from a backlight for displaying.

3. The LCD according to claim 1, wherein the first pixel electrode is disposed in the central portion of the pixel region, and the second pixel electrode is disposed in the periphery of the first pixel electrode.

4. The LCD according to claim 1, wherein a reflecting layer is provided on the black matrixes.

5. The LCD according to claim 1, wherein a common electrode is provided on the color filter substrate.

6. The LCD according to claim 1, wherein the first TFT comprises a first gate electrode, a first active layer, a first source electrode, and a first drain electrode, and
   the second TFT comprises a second gate electrode, a second active layer, a second source electrode, and a second drain electrode.

7. The LCD according to claim 2, wherein the first TFT comprises a first gate electrode, a first active layer, a first source electrode, and a first drain electrode, and
   the second TFT comprises a second gate electrode, a second active layer, a second source electrode, and a second drain electrode.

8. The LCD according to claim 3, wherein the first TFT comprises a first gate electrode, a first active layer, a first source electrode, and a first drain electrode, and
   the second TFT comprises a second gate electrode, a second active layer, a second source electrode, and a second drain electrode.

9. The LCD according to claim 4, wherein the first TFT comprises a first gate electrode, a first active layer, a first source electrode, and a first drain electrode, and
   the second TFT comprises a second gate electrode, a second active layer, a second source electrode, and a second drain electrode.

10. The LCD according to claim 5, wherein the first TFT comprises a first gate electrode, a first active layer, a first source electrode, and a first drain electrode, and
   the second TFT comprises a second gate electrode, a second active layer, a second source electrode, and a second drain electrode.

11. A method of manufacturing a liquid crystal display (LCD), comprising:
  step 1, preparing an array substrate and a color filter substrate, wherein the array substrate the array substrate comprises a gate line, a first data line and a second data line, which define a pixel region, a first pixel electrode and a first thin film transistor (TFT) for controlling the first data line to provide a first data voltage to the first pixel electrode in the pixel region, and a second pixel electrode and a second TFT for controlling the second data line to provide a second data voltage to the second pixel electrode; and wherein the color filter substrate comprises black matrixes and a color resin unit; and
  step 2, assembling the array substrate and the color filter substrate together, wherein the position of the first pixel electrode corresponds to the position of the color resin unit between the black matrixes so as to display a first image on the side of the color filter substrate in a light transmission mode, and the position of the second pixel electrode corresponds to the position of the color resin unit on the black matrixes so as to display a second image on a side of the array substrate in a light reflection mode.

12. The method of manufacturing a LCD according to claim 11, wherein preparing an array substrate comprises:
  step 11, forming patterns including the gate line, the first pixel electrode, and second pixel electrode;
  step 12, forming, on the substrate after step 11, patterns including the first data line, the second data line, a first source electrode, a first drain electrode, a second source electrode, and a second drain electrode;
  step 13, forming, on the substrate after step 12, patterns including a first via hole and a second via hole, wherein the first via hole is formed at the first drain electrode, and the second via hole is formed at the second drain electrode;
  step 14, forming, on the substrate after step 13, patterns including the first pixel electrode and the second pixel electrode, wherein the first pixel electrode is formed in the central portion of the pixel region and connected to the first drain electrode through the first via hole, and the second pixel electrode is formed in the periphery of the pixel region and connected to the second drain electrode through the second via hole.

13. The method of manufacturing a LCD according to claim 12, wherein step 12 is performed with a half-tone or grey tone mask plate.

14. The method of manufacturing a LCD according to claim 12, wherein step 12 is performed with two normal mask plates.

15. The method of manufacturing a LCD according to claim 11, wherein preparing the color filter substrate in step 1 comprises:
  Step 21: forming the black matrixes on a base substrate; and
  Step 22: forming the color resin unit on the substrate after step 21, wherein a part of the color resin unit is formed between the black matrixes, and the other part is formed on the black matrixes.

16. The method of manufacturing a LCD according to claim 15, wherein a reflecting layer is formed on the black matrixes.

17. The method of manufacturing a LCD according to claim 16, wherein a common electrode is formed on the black matrixes, the color filter unit and the reflecting layer.

18. The method of manufacturing a LCD according to claim 15, wherein a common electrode is formed on the black matrixes and the color filter unit.

19. The method of manufacturing a LCD according to claim 11, wherein preparing the color filter substrate in step 1 comprises:
  Step 21: forming a pattern of black matrixes and a reflecting layer on the substrate, wherein the reflecting layer is on the black matrixes; and
  Step 22: forming the color resin unit on the substrate after step 21, wherein a part of the color resin unit is formed between the black matrixes, and the other part is formed on the black matrixes.

* * * * *